United States Patent
Joos

(10) Patent No.: US 12,411,534 B2
(45) Date of Patent: *Sep. 9, 2025

(54) DIAGNOSING POWER RAIL OVER-VOLTAGE AND UNDER-VOLTAGE CONDITIONS

(71) Applicant: SEMICONDUCTOR COMPONENTS INDUSTRIES, LLC, Scottsdale, AZ (US)

(72) Inventor: Dieter Jozef Joos, Nieuwenrode (BE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 182 days.

This patent is subject to a terminal disclaimer.

(21) Appl. No.: 18/366,895

(22) Filed: Aug. 8, 2023

(65) Prior Publication Data

US 2025/0053218 A1    Feb. 13, 2025

(51) Int. Cl.
*H02H 7/00* (2006.01)
*G06F 1/28* (2006.01)
*G06F 1/30* (2006.01)

(52) U.S. Cl.
CPC . *G06F 1/28* (2013.01); *G06F 1/30* (2013.01)

(58) Field of Classification Search
None
See application file for complete search history.

(56) References Cited

U.S. PATENT DOCUMENTS

| | | | | |
|---|---|---|---|---|
| 3,813,667 | A * | 5/1974 | Smith | G01R 19/16547 340/521 |
| 8,402,297 | B2 * | 3/2013 | Fung | G06F 1/26 713/340 |
| 11,269,006 | B2 | 3/2022 | Coyne et al. | |
| 11,348,018 | B2 | 5/2022 | Rao et al. | |
| 2006/0103428 | A1 * | 5/2006 | Shimada | H03K 17/063 326/83 |
| 2012/0221161 | A1 * | 8/2012 | Billingsley | G01R 19/16547 700/295 |
| 2020/0033925 | A1 * | 1/2020 | Young | G06F 1/28 |
| 2023/0078724 | A1 * | 3/2023 | Wang | H04L 9/004 380/28 |

FOREIGN PATENT DOCUMENTS

TW    I765001 B    5/2022

* cited by examiner

*Primary Examiner* — Stephen W Jackson
(74) *Attorney, Agent, or Firm* — Dickinson Wright PLLC

(57) ABSTRACT

Power monitors, power supply circuits, and methods for operating a power supply. The method includes determining a voltage of a power rail provided to a load device from the power supply. The method also includes detecting that the voltage of the power rail is greater than or equal to an over-voltage threshold. The method further includes incrementing an over-voltage counter when the voltage of the power rail is detected as being greater than or equal to the over-voltage threshold. The method also includes detecting that the over-voltage counter is equal to a threshold value. The method further includes generating an interrupt signal when the over-voltage counter is detected as being equal to the threshold value.

20 Claims, 12 Drawing Sheets

DIAGNOSING POWER RAIL OVER-VOLTAGE AND UNDER-VOLTAGE CONDITIONS

BACKGROUND

Vehicles, such as passenger cars and trucks, may include several different electrical systems to perform various functions. Many such electrical systems include data-fusion or data-processing System-on-a-Chip (SoC) devices. Data-fusion or data-processing SoCs may require many power rails, at least some of which may be safety critical. For example, dedicated power-up and power-down should be respected for reliability, and the tolerance of voltages on the power rails should be monitored to guarantee computing integrity. Both can impact the functional safety of the SoC and the corresponding electrical systems. Any deviations from specified values should be detected and, depending on the system, specific actions should be performed to set the system in a safe state (for example, by initiating a power-down or setting a signaling pin to a predefined level).

SUMMARY

Brief over-voltage and under-voltage events may not cause damage to electronics. However, in the case of periodic over-voltage and under-voltage events, the lifetime of a System-on-a-Chip (SoC) device may be reduced. Slow deglitched-comparators often fail to detect brief over-voltage and under-voltage events. Further, current fast diagnostic measurement systems have the drawback that their measurement bandwidths are very large and their detection-thresholds may vary as a consequence of circuit noise, which may lead to false positive over-voltage and under-voltage detections. Thus, the present disclosure provides power monitors, power supply circuits, and methods that, among other things, digitally post-process over-voltage and under-voltage detections from a fast analog comparator using programmable thresholds to detect safety critical events.

The present disclosure provides a method for operating a power supply. The method includes determining a voltage of a power rail provided to a load device from the power supply. The method also includes detecting that the voltage of the power rail is greater than or equal to an over-voltage threshold. The method further includes incrementing an over-voltage counter when the voltage of the power rail is detected as being greater than or equal to the over-voltage threshold. The method also includes detecting that the over-voltage counter is equal to a threshold value. The method further includes generating an interrupt signal when the over-voltage counter is detected as being equal to the threshold value.

The present disclosure also provides a power monitor including, in one implementation, a voltage fault detector and a controller. The voltage fault detector is configured to determine a voltage of a power rail provided to a load device from a power supply. The voltage fault detector is also configured to detect when the voltage of the power rail is greater than or equal to an over-voltage threshold. The controller is configured to increment an over-voltage counter when the voltage fault detector detects that the voltage of the power rail is greater than or equal to the over-voltage threshold. The controller is also configured to generate an interrupt signal when the over-voltage counter is equal to a threshold value.

The present disclosure further provides a power supply circuit including, in one implementation, a power supply and a power monitor. The power supply is configured to provide a power rail to a load device. The power monitor is configured to detect when a voltage of the power rail is greater than or equal to an over-voltage threshold. The power monitor is also configured to increment an over-voltage counter each time the power monitor detects that the voltage of the power rail is greater than or equal to the over-voltage threshold. The power monitor is further configured to generate an interrupt signal when the over-voltage counter is equal to a threshold value.

BRIEF DESCRIPTION OF THE DRAWINGS

For a detailed description of example implementations, reference will now be made to the accompanying drawings in which.

DEFINITIONS

Figure 1:
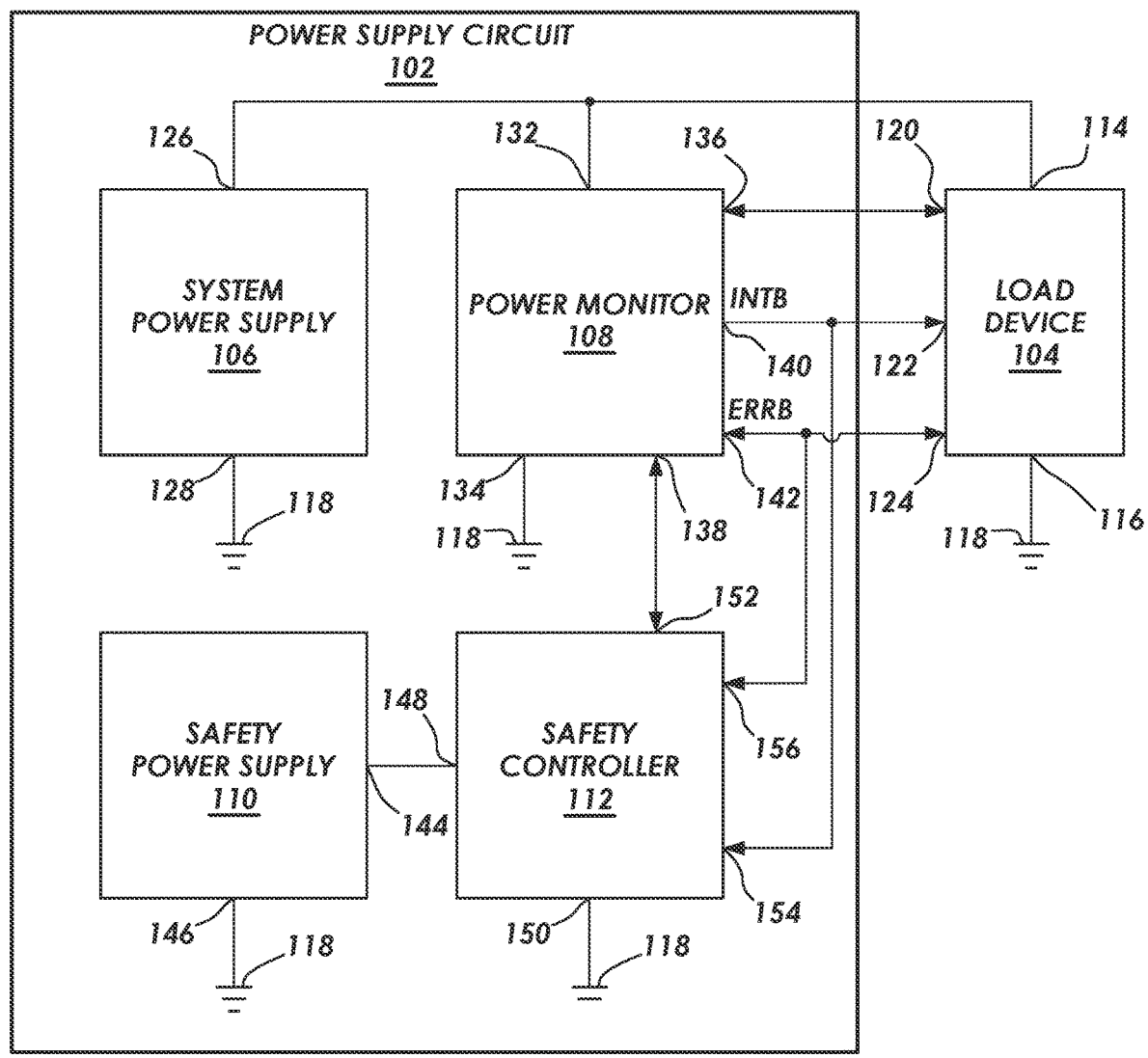
FIG. 1 is a block diagram of an example of a power supply circuit for a load device in accordance with some implementations.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

In relation to electrical devices, whether stand alone or as part of an integrated circuit, the terms "input" and "output" refer to electrical connections to the electrical devices, and shall not be read as verbs requiring action. For example, a differential amplifier, such as an operational amplifier, may have a first differential input and a second differential input, and these "inputs" define electrical connections to the operational amplifier, and shall not be read to require inputting signals to the operational amplifier.

"Assert" shall mean changing the state of a Boolean signal. Boolean signals may be asserted high or with a higher voltage, and Boolean signals may be asserted low or with a lower voltage, at the discretion of the circuit designer. Similarly, "de-assert" shall mean changing the state of the Boolean signal to a voltage level opposite the asserted state.

"Controller" shall mean, alone or in combination, individual circuit components, an application specific integrated circuit (ASIC), one or more microcontrollers with controlling software, a reduced-instruction-set computer (RISC) with controlling software, a digital signal processor (DSP), one or more processors with controlling software, a programmable logic device (PLD), a field programmable gate array (FPGA), or a programmable system-on-a-chip (PSOC), configured to read inputs and drive outputs responsive to the inputs.

DETAILED DESCRIPTION

The following discussion is directed to various implementations of the invention. Although one or more of these implementations may be preferred, the implementations disclosed should not be interpreted, or otherwise used, as limiting the scope of the present disclosure, including the claims. In addition, one skilled in the art will understand that the following description has broad application, and the discussion of any implementation is meant only to be exemplary of that implementation, and not intended to intimate that the scope of the present disclosure, including the claims, is limited to that implementation.

Various examples are directed to methods and systems of power management with over-voltage and under-voltage tracking. More particularly, various examples are directed to power supplies and related power monitors that track various statistics of over-voltage and under-voltage events in power rails. More particularly still, various examples are directed to power supplies and related power monitors that use fast analog comparators to detect over-voltage and under-voltage events in power rails. The specification now turns to an example system to orient the reader.

FIG. 1 is a block diagram of an example of a power supply circuit 102 for a load device 104 in accordance with some implementations of the present disclosure. The power supply circuit 102 illustrated in FIG. 1 includes a system power supply 106, a power monitor 108, a safety power supply 110, and a safety controller 112. In some implementations, the power supply circuit 102 may include more components, fewer components, or different components than the ones illustrated in FIG. 1. For example, aside from the connections described below, additional input and output connections will be present (for example, data connections, additional power connections, reference voltage connections, and additional ground connections), but those additional input and output connections are not shown so as not to unduly complicate the figure. Further, in some implementations, the safety controller 112 may be located external to the power supply circuit 102.

In some implementations, the load device 104 includes a System-on-a-Chip (SoC) device or other supplied system. For example, the load device 104 may include a vehicle SoC device configured for data-fusion. The vehicle SoC device may be configured to gather sensor data from one or more vehicle sensors. For example, the vehicle SoC device may receive sensor data from radar sensors, LIDAR sensors, ultrasonic sensors, image sensors, or a combination thereof. The vehicle SoC device may also be configured to process the sensor data. For example, the vehicle SoC device may use the sensor data to determine the positions and relative movements of vehicles, pedestrians, and other objects located around the subject vehicle.

Different components included in the load device 104 may be configured to operate at specific direct-current (DC) voltages. For example, some components in the load device 104 may be configured to operate at 0.6 Volts and other components in the load device 104 may be configured to operate at 1.2 Volts. In some implementations, the load device 104 is configured to receive several DC voltages, each of which is known as a power rail. For example, the load device 104 may include an SoC device configured to receive twenty power rails. The load device 104 illustrated in FIG. 1 includes a rail supply connection 114 coupled to the system power supply 106 to receive a rail supply therefrom. The load device 104 may include additional rail supply connections for each power rail, but those additional connections are not shown so as not to unduly complicate the figure.

The load device 104 illustrated in FIG. 1 also includes a reference connection 116 coupled to a reference terminal 118 (for example, a ground terminal). The voltage of the power rail is equal to the difference between the voltage of the rail supply present at the rail supply connection 114 and a reference voltage present at the reference terminal 118. The load device 104 illustrated in FIG. 1 further includes a data connection 120 for communicating with the power monitor 108. The load device 104 illustrated in FIG. 1 also includes a first control input 122 coupled to the power monitor 108 to receive an interrupt signal (INTB) therefrom. The load device 104 illustrated in FIG. 1 further includes a second control input 124 coupled to the power monitor 108 to receive a shutdown signal (ERRB) therefrom. In some implementations, when the load device 104 receives the shutdown signal, the load device 104 may stop communicating with other devices external to the load device 104.

The system power supply 106 is configured to generate one or more power rails for the load device 104. The system power supply 106 illustrated in FIG. 1 includes a rail supply output 126 coupled to the rail supply connection 114 of the load device 104 to provide a rail supply thereto. In some implementations, the system power supply 106 may include additional rail supply outputs to provide different rail supplies to the load device 104. The system power supply 106 illustrated in FIG. 1 also includes a reference connection 128 coupled to the reference terminal 118.

The system power supply 106 includes or is coupled to a battery (not shown). In some implementations, a single battery is sufficient. In alternate implementations, multiple batteries may be used (for example, in series or in parallel). A variety of types of batteries can be used in the power supply circuit 102, dependent on the type of the load device 104. In some implementations, the battery provides a supply voltage of about than 12 Volts. In some implementations, the battery is rechargeable. In alternate implementations, the battery is disposable.

The system power supply 106 may include any suitable device configured to generate one or more power rails based on a supply voltage from the battery. For example, the system power supply 106 may include a charge pump configured to generate an output voltage that may be a predetermined ratio of the supply voltage. The ratio may be programmable to any suitable value. Suitable values may include ratios such as '1/1' (LDO mode, charge pump disabled), '4/5', '3/4', '2/3', '1/2', and '1/3'. Thus, by changing the ratio and/or the operating frequency, the voltage of the power rail may be selectively controlled. In some implementations, the system power supply 106 may include a switched-mode power converter configured to generate a modified output voltage by varying a duty cycle of a switching device. Alternatively, or in addition, the system power supply 106 may include a linear regulator comprising a step-down converter configured to modify the voltage of the power rail. Alternatively, or in addition, the linear regulator may be combined with another device (for example, a charge pump or a switched-mode power converter) to supply and regulate the voltage of the power rail.

Each power rail may include a range of acceptable voltages. For example, 4.75 Volts to 5.25 Volts may be the range of acceptable voltages for a 5-Volt power rail. An over-voltage event occurs in the power rail when the voltage of the power rail rises above the range of acceptable voltages. Further, an under-voltage event occurs in a power rail when the voltage of the power rail falls below the range of acceptable voltages. The power monitor 108 is configured to detect over-voltage and under-voltage events in the one or more power rails provided to the load device 104.

The power monitor 108 generates an interrupt signal to inform the load device 104 and the safety controller 112 of a possible risk for which there is still time to react. The power monitor 108 is configured to generate an interrupt signal upon detecting over-voltage conditions that may reduce the lifetime of the load device 104 or under-voltage conditions that may indicate the potential for undesirable operation of the load device 104, as will be described in more detail below. The power monitor 108 may generate a shutdown signal to inform the load device 104 and the safety controller 112 of an immediate risk for which an emergency shutdown of the system power supply 106 is needed. In some implementations, the power monitor 108 generates a shutdown signal upon detecting over-voltage conditions that may almost instantly cause damage to the components of the load device 104 or under-voltage conditions that may almost instantly cause undesirable operation of the load device 104, as will be described in more detail below.

The power monitor 108 illustrated in FIG. 1 includes a rail supply connection 132 coupled to the rail supply connection 114 of the load device 104 to receive the rail supply provided to the load device 104. In some implementations, the power monitor 108 may include additional rail supply connections to receive different rail supplies provided to the load device 104. The power monitor 108 illustrated in FIG. 1 also includes a reference connection 134 coupled to the reference terminal 118. The power monitor 108 illustrated in FIG. 1 further includes a first data connection 136 for communicating with the load device 104. The data connection 120 of the load device 104 and the first data connection 136 of the power monitor 108 together form a system interface. The system interface may be a two-wire based interface such as an I2C interface, an I3C interface, or a Universal Asynchronous Receiver/Transmitter (UART). The system interface may also be a three-wire or four-wire based interface such as a serial peripheral interface (SPI), a Dual SPI (DSPI), and a Quad SPI (QSPI). The power monitor 108 illustrated in FIG. 1 also includes a second data connection 138 for communicating with the safety controller 112. The power monitor 108 illustrated in FIG. 1 further includes a first control output 140 coupled to the first control input 122 of the load device 104 to send the interrupt signal thereto. The first control output 140 is also coupled to the safety controller 112 to send the interrupt signal thereto. The power monitor 108 illustrated in FIG. 1 further includes a second control output 142 coupled to the second control input 124 of the load device 104 to send the shutdown signal thereto. The second control output 142 is also coupled to the safety controller 112 to send the shutdown signal thereto.

The safety power supply 110 is configured to supply power to the safety controller 112 independent of the system power supply 106. The safety power supply 110 illustrated in FIG. 1 includes a supply output 144 coupled to the safety controller 112 to provide power thereto. The safety power supply 110 illustrated in FIG. 1 also includes a reference connection 146 coupled to the reference terminal 118. The safety power supply 110 may include any suitable device configured to generate power for the safety controller 112 based on a supply voltage from the battery (including, for example, devices similar to any of the devices described above in relation to the system power supply 106). The safety power supply 110 many include or be coupled to a device (not shown) configured to monitor the power supplied to the safety controller 112.

The safety controller 112 illustrated in FIG. 1 includes a supply connection 148 coupled to the safety power supply 110 to receive power therefrom. The safety controller 112 illustrated in FIG. 1 also includes a reference connection 150 coupled to the reference terminal 118. The safety controller 112 illustrated in FIG. 1 further includes a data connection 152 for communicating with the power monitor 108. The data connection 152 of the safety controller 112 and the second data connection 138 of the power monitor 108 together form a system interface. The safety controller 112 illustrated in FIG. 1 also includes a first control input 154 coupled to the first control output 140 of the power monitor 108 to receive the interrupt signal therefrom. The safety controller 112 illustrated in FIG. 1 further includes a second control input 124 coupled to the second control output 142 of the power monitor 108 to receive the shutdown signal therefrom.

Figure 2:
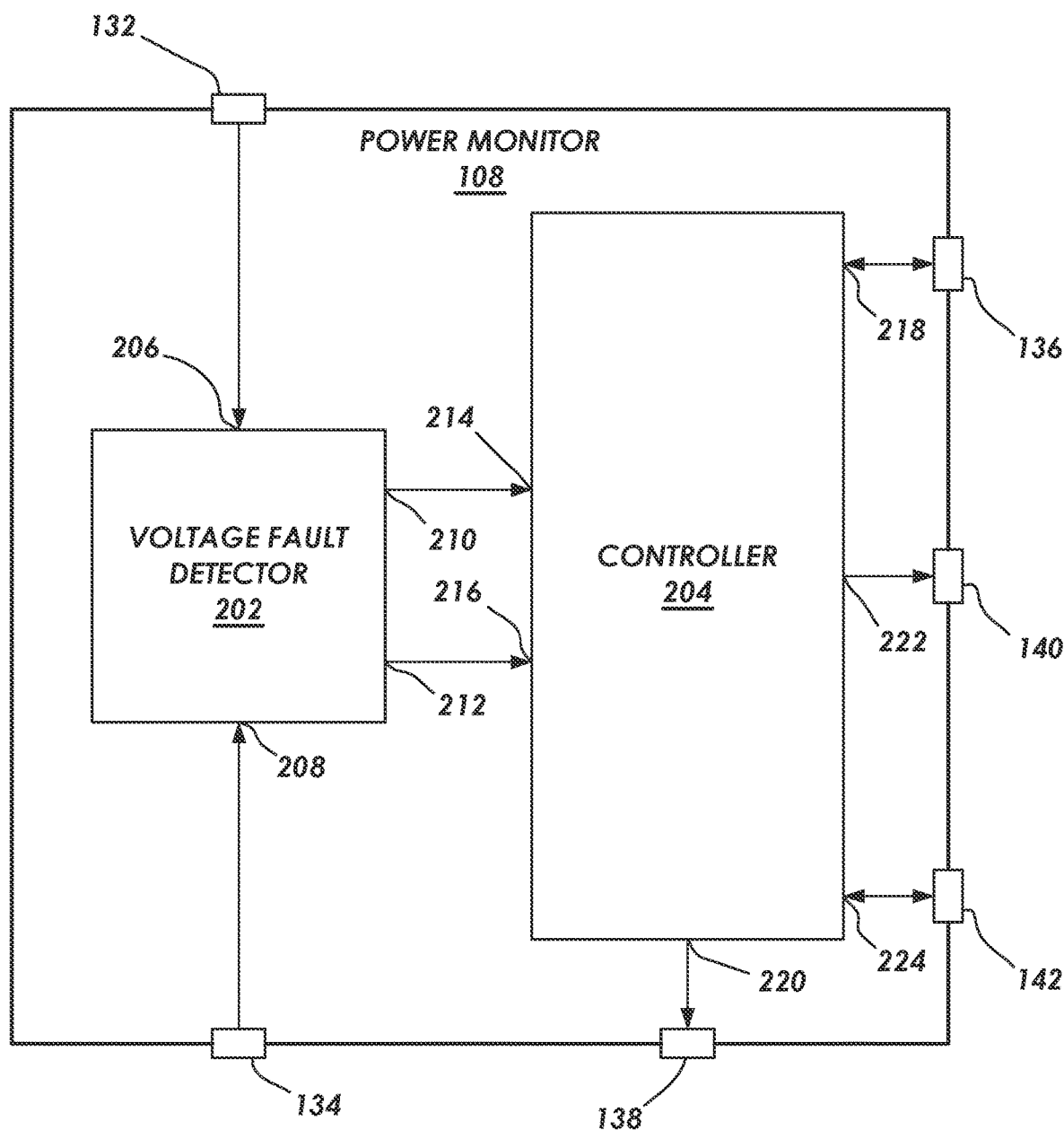
FIG. 2 is a block diagram of an example of a power monitor included in the power supply circuit of FIG. 1 in accordance with some implementations.

FIG. 2 is an example of a block diagram of the power monitor 108 in accordance with some implementations of the present disclosure. The power monitor 108 illustrated in FIG. 2 includes a voltage fault detector 202 and a controller 204. In some implementations, the power monitor 108 may include more components, fewer components, or different components than the ones illustrated in FIG. 2. For example, aside from the connections described below, additional input and output connections will be present (for example, power connections, reference voltage connections, and ground connections), but those additional input and output connections are not shown so as not to unduly complicate the figure.

The voltage fault detector 202 is configured to detect under-voltage and over-voltage events in the power rail provided to the load device 104. The voltage fault detector 202 may include a fast analog comparator. The voltage fault detector 202 illustrated in FIG. 2 includes a first voltage input 206 coupled to the rail supply connection 132 to receive the rail supply provided to the load device 104. The voltage fault detector 202 illustrated in FIG. 2 also includes a second voltage input 208 coupled to the reference connection 134 to receive the reference voltage provided to the load device 104. The voltage fault detector 202 illustrated in FIG. 2 further includes a first control output 210 coupled to the controller 204 to send over-voltage detection signals thereto, as will be described in more detail below. The voltage fault detector 202 illustrated in FIG. 2 also includes a second control output 212 coupled to the controller 204 to send under-voltage detection signals thereto, as will be described in more detail below.

The controller 204 is configured to track over-voltage and under-voltage events in the power rail. The controller 204 illustrated in FIG. 2 includes a first control input 214, a second control input 216, a first data connection 218, a second data connection 220, a first control output 222, and a second control output 224. The first control input 214 is coupled to the first control output 210 of the voltage fault detector 202 to receive over-voltage detection signals therefrom. The second control input 216 is coupled to the second control output 212 of the voltage fault detector 202 to receive under-voltage detection signals therefrom. The first data connection 218 of the controller 204 is coupled to the first data connection 136 of the power monitor 108. The second data connection 220 of the controller 204 is coupled to the second data connection 138 of the power monitor 108. The first control output 222 of the controller 204 is coupled to the first control output 140 of the power monitor 108 to send interrupt signals. The controller 204 is configured to generate an interrupt signal when specific over-voltage and under-voltage conditions are detected, as will be described in more detail below. The second control output 224 of the controller 204 is coupled to the second control output 142 of the power monitor 108 to send shutdown signals. In some implementations, the controller 204 is configured to generate a shutdown signal when the specific over-voltage and under-voltage conditions are detected, as will be described in more detail below.

Figure 3:
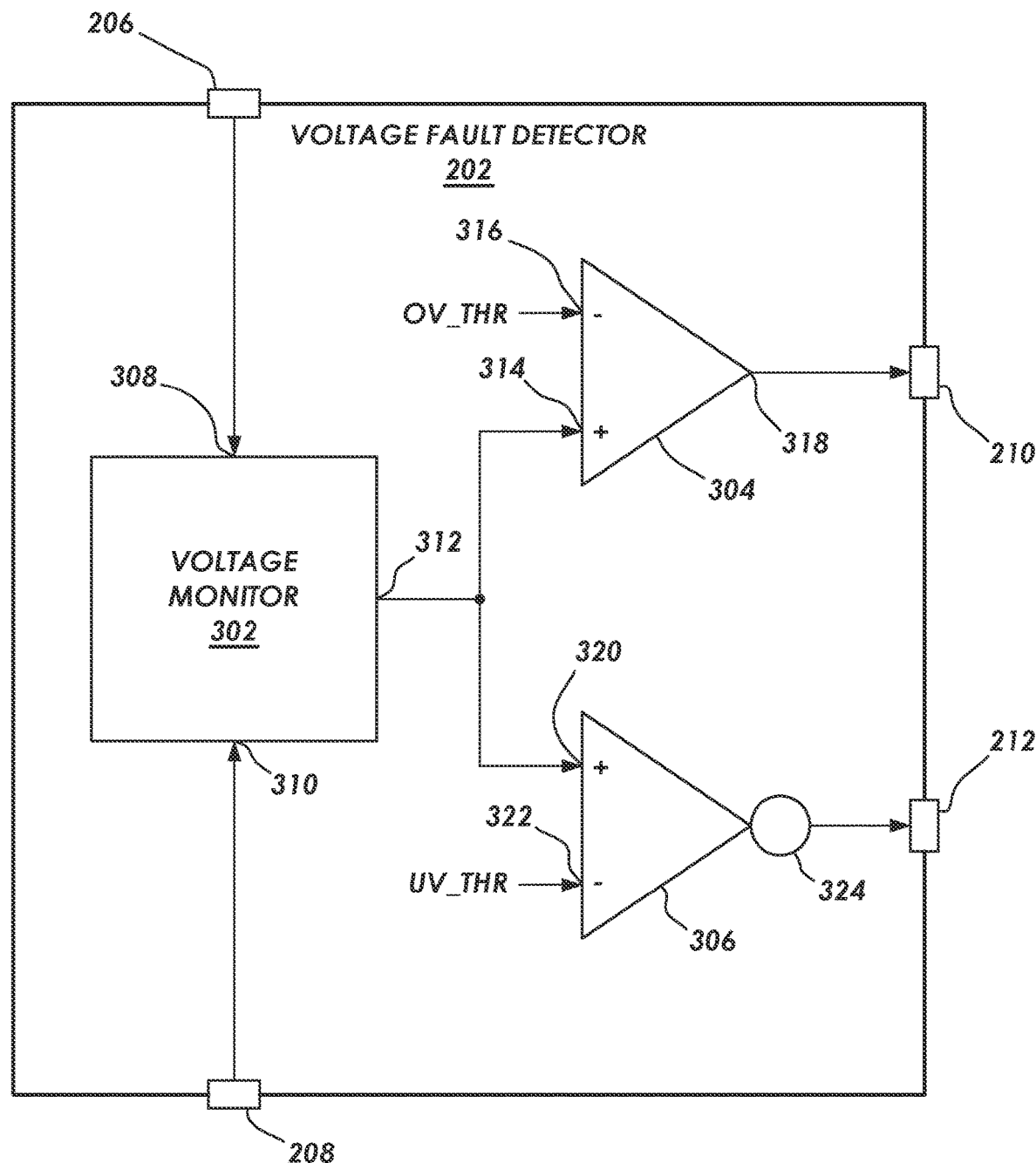
FIG. 3 is a partial schematic and partial block diagram of a voltage fault detector included in the power monitor of FIG. 2 in accordance with some implementations.

FIG. 3 is an example of a partial schematic and partial block diagram of the voltage fault detector 202 in accordance with some implementations of the present disclosure. The voltage fault detector 202 illustrated in FIG. 3 includes a voltage monitor 302, an over-voltage comparator 304, and an under-voltage comparator 306. In some implementations, the voltage fault detector 202 may include more components, fewer components, or different components than the ones illustrated in FIG. 3. For example, power connections, reference voltage connections, and additional ground connections used for power, sensing, or other purposes will be present, but those additional connections are not shown so as not to unduly complicate the figure.

The voltage monitor 302 is configured to determine the voltage of the power rail. The voltage monitor 302 illustrated in FIG. 3 includes a first voltage input 308 coupled to the first voltage input 206 to receive the rail supply provided to the load device 104. The voltage monitor 302 illustrated in FIG. 3 also includes a second voltage input 310 coupled to the second voltage input 208 to receive the reference voltage provided to the load device 104. The voltage monitor 302 illustrated in FIG. 3 further includes a voltage output 312 coupled to the over-voltage comparator 304 and the under-voltage comparator 306. The voltage monitor 302 determines the voltage of the power rail as the difference between the voltage of the rail supply and the voltage of the reference voltage. In this manner, the voltage monitor 302 accounts for, among other things, variations in the reference voltage.

The over-voltage comparator 304 is configured to detect over-voltage events in the power rail provided to the load device 104. The over-voltage comparator 304 illustrated in FIG. 3 includes a non-inverting input 314, an inverting input 316, and an output 318. The non-inverting input 314 of the over-voltage comparator 304 is coupled to the voltage output 312 of the voltage monitor 302 to receive the voltage of the power rail therefrom. The inverting input 316 of the over-voltage comparator 304 is coupled to a reference voltage that represents an over-voltage threshold (OV_THR). The over-voltage threshold is the minimum voltage level of the power rail which may reduce the lifetime of the load device 104. The over-voltage threshold may be set based on the technology used in the load device 104. In some implementations, the over-voltage threshold is set to be 5% greater than the target voltage of the power rail. The output 318 of the over-voltage comparator 304 is coupled to the first control output 210. When the voltage of the power rail is greater than or equal to the over-voltage threshold, the over-voltage comparator 304 generates a logic-high signal on the output 318. Alternatively, when the voltage of the power rail is less than the over-voltage threshold, the over-voltage comparator 304 generates a logic-low signal on the output 318.

The under-voltage comparator 306 is configured to detect under-voltage events in the power rail provided to the load device 104. The under-voltage comparator 306 illustrated in FIG. 3 includes a non-inverting input 320, an inverting input 322, and an output 324. The non-inverting input 320 of the under-voltage comparator 306 is coupled to the voltage output 312 of the voltage monitor 302 to receive the voltage of the power rail therefrom. The inverting input 322 of the under-voltage comparator 306 is coupled to a reference voltage that represents an under-voltage threshold (UV_THR). The under-voltage threshold is the maximum voltage level of the power rail at which prolonged exposure or multiple exposures within a short time (for example, within 100 microseconds) may increase the chances that the load device 104 makes calculation errors. The under-voltage threshold may be set based on the technology used in the load device 104. In some implementations, the under-voltage threshold is set to be 5% less than the target voltage of the power rail. The output 324 of the under-voltage comparator 306 is coupled to the second control output 212. When the voltage of the power rail is less than or equal to the under-voltage threshold, the under-voltage comparator 306 generates a logic-high signal on the output 324. Alternatively, when the voltage of the power rail is greater than the under-voltage threshold, the under-voltage comparator 306 generates a logic-low signal on the output 324.

Returning to FIG. 2, the controller 204 is configured to track over-voltage events using an over-voltage counter. For example, each time the controller 204 receives an over-voltage detection signal from the voltage fault detector 202, the controller 204 may increment the over-voltage counter. In some implementations, the controller 204 may increment the over-voltage counter by increasing the value of the over-voltage counter by one. For example, when the controller 204 receives an over-voltage detection signal from the voltage fault detector 202, the controller 204 may increase the over-voltage counter from three to four. In alternate implementations, the controller 204 may increment the over-voltage counter by decreasing the value of the over-voltage counter by one. The controller 204 is also configured to generate interrupt signals based on the value of the over-voltage counter, as will be described in more detail below.

Figure 4:
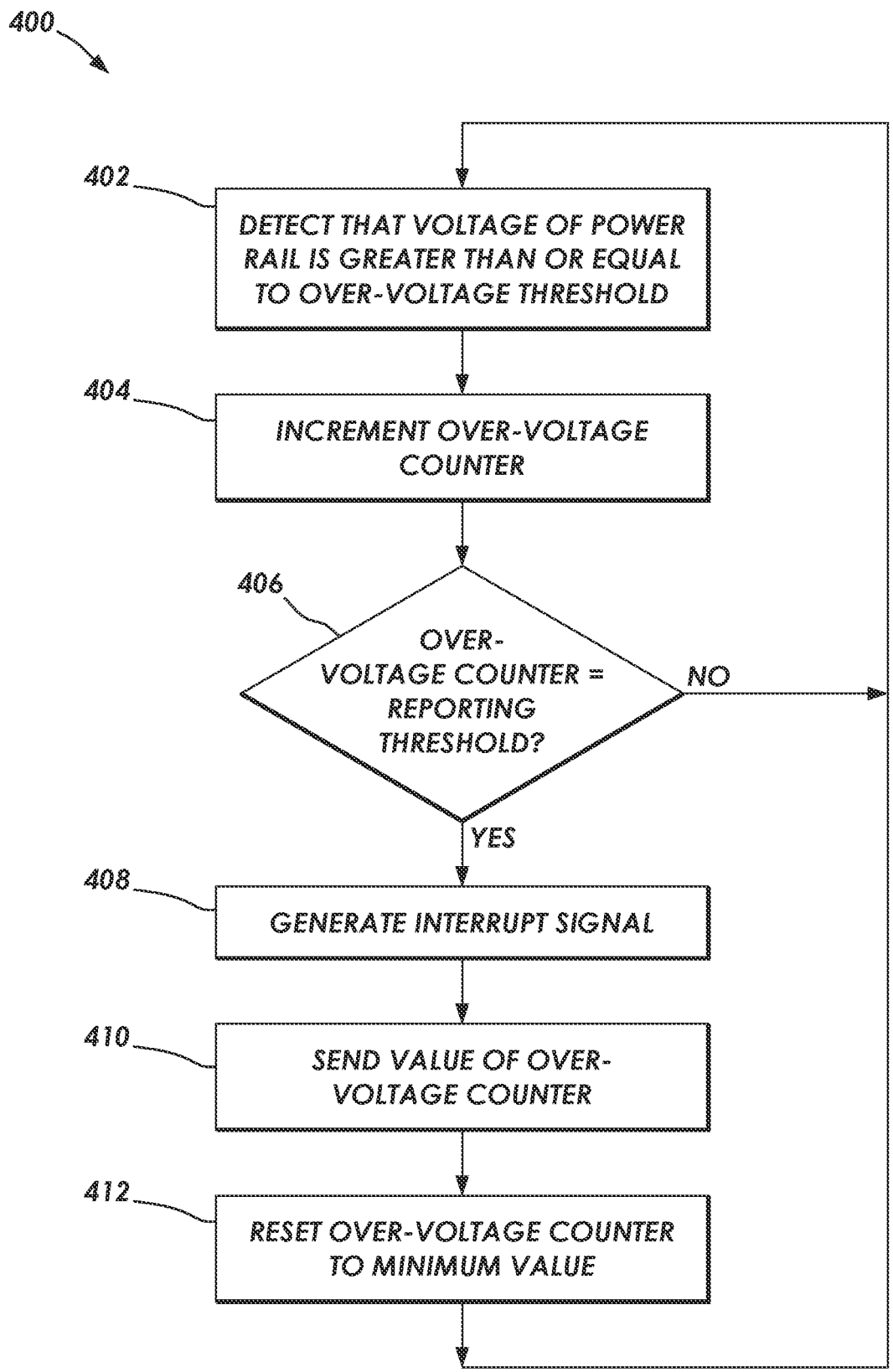
FIG. 4 is a flow diagram of an example of a method for tracking over-voltage events of a power rail in accordance with some implementations.

In some implementations, the controller 204 may generate an interrupt signal when the over-voltage counter indicates that the total number of over-voltage events is equal to a reporting threshold. FIG. 4 is a flow diagram of an example of a method 400 for tracking over-voltage events of a power rail in accordance with some implementations. For simplicity of explanation, the method 400 is described as a series of operations performed by the controller 204. However, the operations in accordance with the method 400 may be performed by different components. At block 402, the controller 204 detects that the voltage of the power rail is greater than or equal to an over-voltage threshold. For example, the controller 204 may detect that the voltage of the power rail is greater than or equal to the over-voltage threshold when the controller 204 receives an over-voltage detection signal from the voltage fault detector 202.

Figure 5:
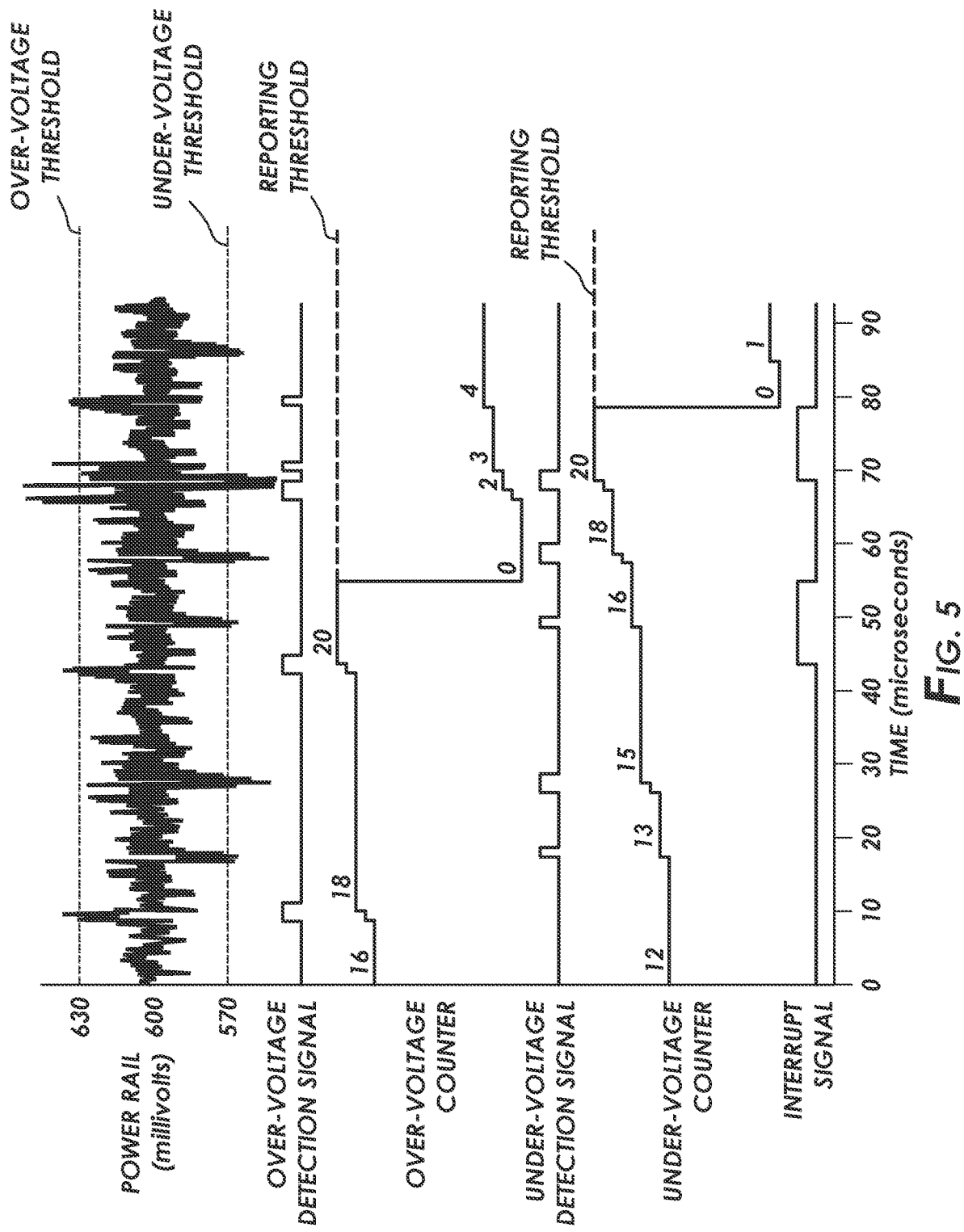
FIG. 5 is a timing diagram of an example of generating interrupt signals based on over-voltage and under-voltage detections in accordance with some implementations.

Next, at block 404, the controller 204 increments the over-voltage counter. For example, FIG. 5 illustrates a timing diagram of an over-voltage counter. As illustrated in FIG. 5, the value of the over-voltage counter is increased by one each time the voltage of the power rail is greater than or equal to the over-voltage threshold of 630 millivolts. Returning to FIG. 4, at block 406, the controller 204 determines whether the over-voltage counter is equal to a reporting threshold. The reporting threshold is one example of a "threshold value" or a "first threshold value." When the over-voltage counter is not equal to the reporting threshold, the method 400 returns to block 402 to again detect that the voltage of the power rail is greater than or equal to the over-voltage threshold. Alternatively, when the over-voltage counter is equal to the reporting threshold, the controller 204 generates an interrupt signal at block 408. For example, in FIG. 5, an interrupt signal is generated when the value of the over-voltage counter reaches the reporting threshold of twenty at about 44 microseconds. The interrupt signal is sent to the load device 104 and the safety controller 112 as described above. After block 408 in FIG. 4, the controller 204 sends the value of the over-voltage counter at block 410. In some implementations, responsive to receiving the interrupt signal, the load device 104 may read-out the value of the over-voltage counter via the system interface formed between the first data connection 136 of the power monitor 108 and the data connection 120 of the load device 104. Alternatively, or in addition, responsive to receiving the interrupt signal, the safety controller 112 may read-out the value of the over-voltage counter via the system interface formed by the second data connection 138 of the power monitor 108 and the data connection 152 of the safety controller 112.

Upon receiving the value of the over-voltage counter, the load device 104 may use the value of the over-voltage counter to predict the end-of-life of the load device 104. For example, the load device 104 may track the total number of over-voltage events over its lifetime and determine when the load device 104 may fail due to excessive over-voltage events. When the voltage of the power rail is outside of the range of acceptable voltages for the load device 104 due to a malfunction in the system power supply 106, the load device 104 may be unable to correctly determine an appropriate response after receiving an interrupt signal. However, as described above, the safety controller 112 receives power from an independent supply (i.e., safety power supply 110). Thus, upon receiving the interrupt signal and the value of the over-voltage counter, the safety controller 112 may determine whether any corrective action needs to be taken. For example, the safety controller 112 may instruct the system power supply 106 to adjust the target voltage of the power rail to accommodate for voltage drifts and other effects that might impact the power rail. Further, the safety controller 112 may instruct the system power supply 106 to perform a normal power down sequence based on a flag type included in the interrupt signal. For example, the safety controller 112 may send one or more control signals to the system power supply 106 which cause the system power supply 106 to sequentially disable the power rails in a predetermined sequence. Further, the safety controller 112 may identify abnormal power rail behavior by detecting when the frequency of interrupt signals increases over time.

Returning to FIG. 4, after the value of the over-voltage counter is sent at block 410, the over-voltage counter is reset to a minimum value at block 412. In some implementations, the over-voltage counter is reset as part of a read-out operation. For example, the load device 104 or the safety controller 112 may perform a clear-by-read operation that reads-out and resets the value of the over-voltage counter. Alternatively, or in addition, the value of the over-voltage counter is overwritten. For example, the load device 104 or the safety controller 112 may perform a clear-by-write operation to reset the over-voltage counter. For example, in FIG. 5, the over-voltage counter is reset to zero after the value of the over-voltage counter is sent to the load device 104 at about 55 microseconds. After block 412 in FIG. 4, the method 400 returns to block 402 to again detect that the voltage of the power rail is greater than or equal to the over-voltage threshold.

The controller 204 is configured to track under-voltage events using an under-voltage counter. For example, each time the controller 204 receives the under-voltage detection signal from the voltage fault detector 202, the controller 204 may increment the under-voltage counter. In some implementations, the controller 204 may increment the under-voltage counter by increasing the value of the under-voltage counter by one. For example, FIG. 5 illustrates a timing diagram of an over-voltage counter. As illustrated in FIG. 5, the value of the under-voltage counter is increased by one each time the voltage of the power rail is less or equal to the under-voltage threshold of 570 millivolts. In alternate implementations, the controller 204 may increment the under-voltage counter by decreasing the value of the under-voltage counter by one. The controller 204 is also configured to generate interrupt signals based on value of the over-voltage counter. In some implementations, the controller 204 may generate an interrupt signal when the under-voltage counter indicates that the total number of under-voltage events reaches a reporting threshold. For example, an interrupt signal is generated in FIG. 5 when the value of the under-voltage counter is equal to the reporting threshold of twenty at about 69 microseconds. The reporting threshold used for under-voltage events (an example of a "second threshold value") may be the same or different than the reporting threshold used for over-voltage events.

Figure 6:
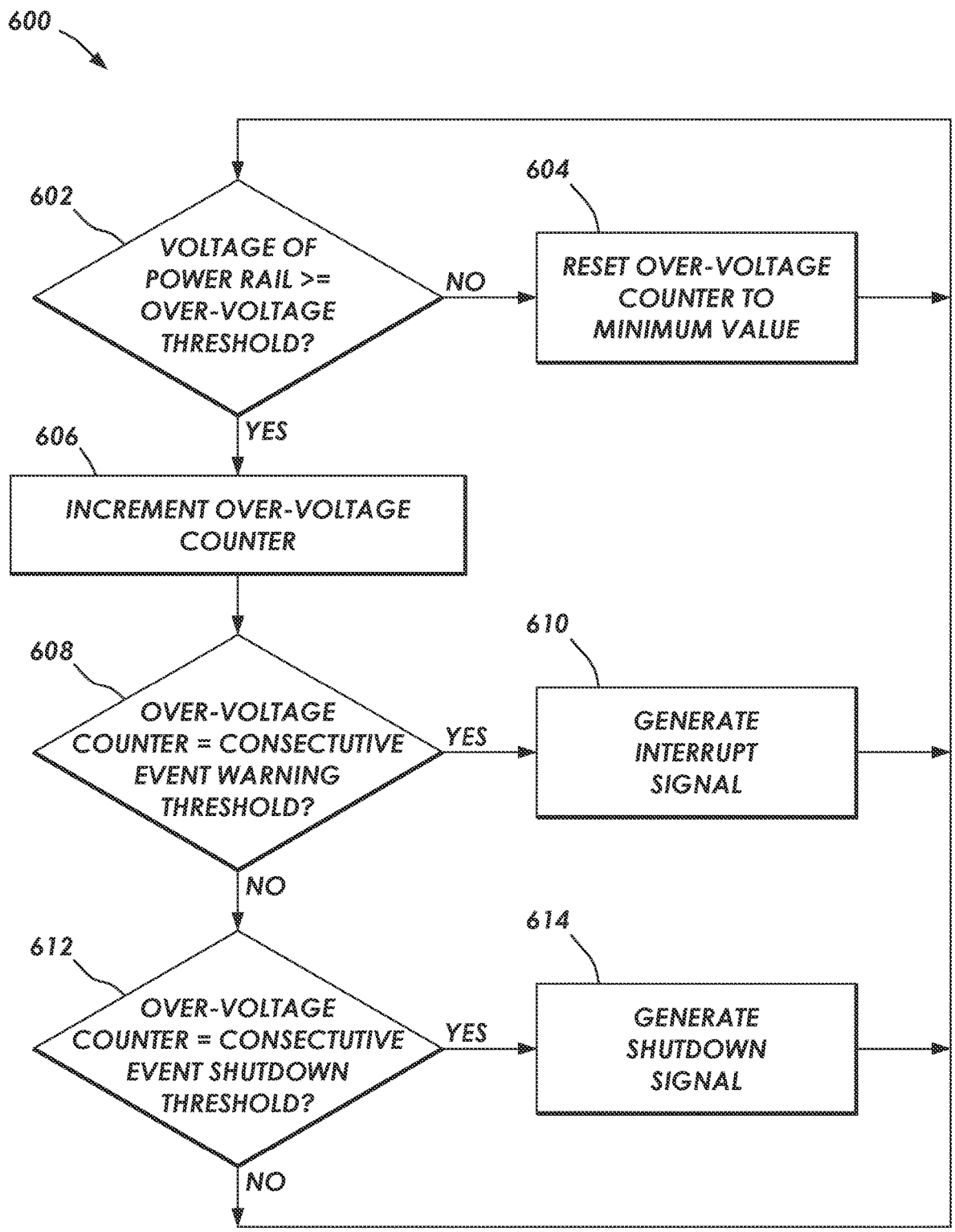
FIG. 6 is a flow diagram of an example of a method for tracking consecutive over-voltage events of a power rail in accordance with some implementations.

In some implementations, the controller 204 may generate an interrupt signal when the over-voltage counter indicates that the number of consecutive over-voltage events is equal to a consecutive event warning threshold. Further, in some implementations, the controller 204 may generate a shutdown signal when the over-voltage counter indicates that the number of consecutive over-voltage events is equal to a consecutive event shutdown threshold that is greater than the consecutive event warning threshold. FIG. 6 is a flow diagram of an example of a method 600 for tracking consecutive over-voltage events of a power rail in accordance with some implementations. For simplicity of explanation, the method 600 is described as a series of operations performed by the controller 204. However, the operations in accordance with the method 600 may be performed by different components. At block 602, the controller 204 determines whether the voltage of the power rail is greater than or equal to an over-voltage threshold. When the voltage of the power rail is less than the over-voltage threshold, the controller 204 resets the over-voltage counter to a minimum value, at block 604. For example, the controller 204 may reset the over-voltage counter by setting the value of the over-voltage counter equal to zero. Next, the method 600 returns to block 602 to again determine whether the voltage of the power rail is greater than or equal to the over-voltage threshold.

Figure 7:
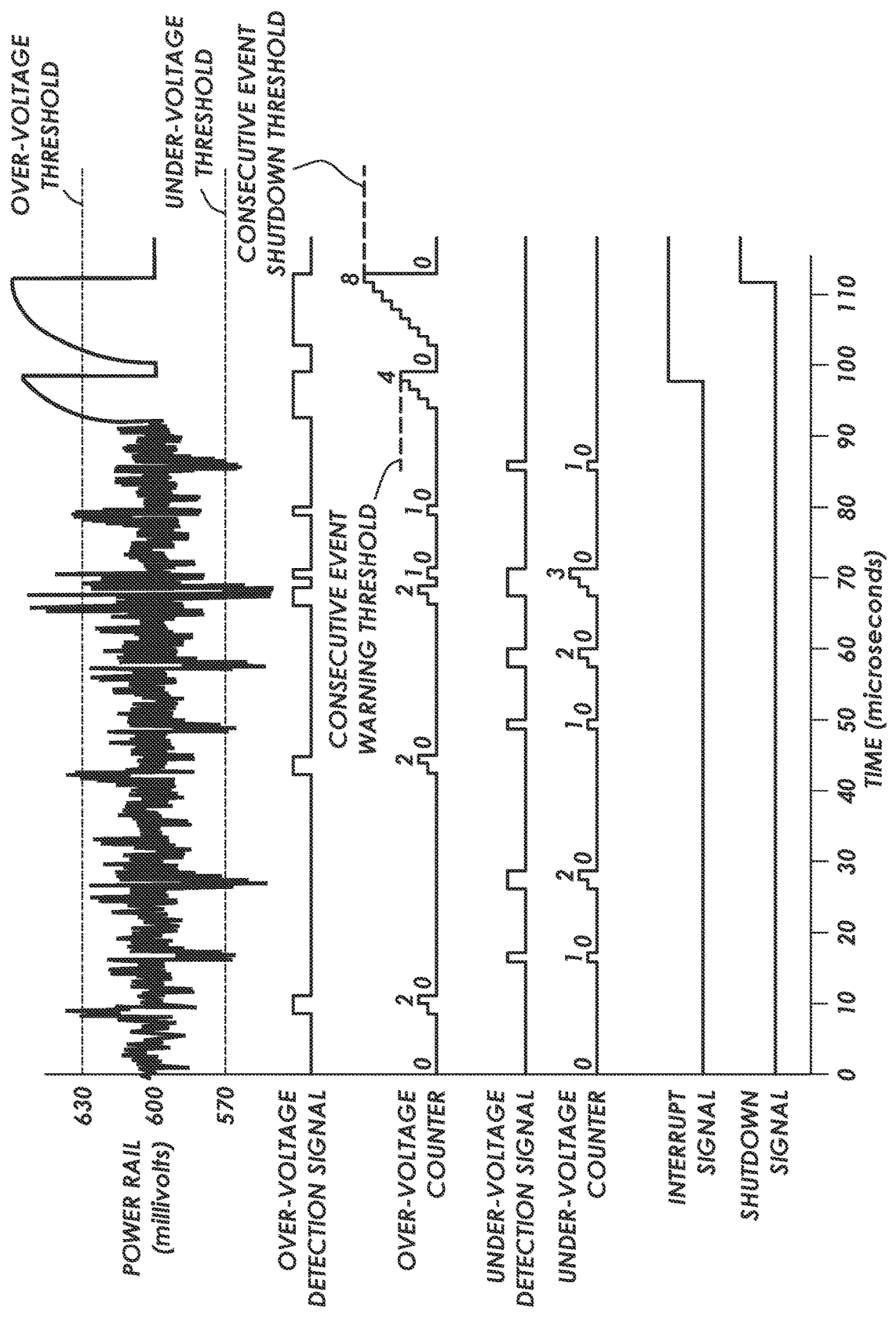
FIG. 7 is a timing diagram of an example of generating interrupt and shutdown signals based on consecutive over-voltage and under-voltage events in accordance with some implementations.

When the voltage of the power rail is greater than or equal to the over-voltage threshold, the controller 204 increments the over-voltage counter at block 606. For example, FIG. 7 illustrates a timing diagram of an over-voltage counter that counts consecutive over-voltage events. As illustrated in FIG. 7, the value of the over-voltage counter is increased by one each time the voltage of the power rail is greater than or equal to the over-voltage threshold of 630 millivolts. Further, the value of the over-voltage counter in FIG. 7 is reset to zero each time the voltage of the power rail is less than the over-voltage threshold. Returning to FIG. 6, at block 608, the controller 204 determines whether the over-voltage counter is equal to a consecutive event warning threshold. In general, the consecutive event warning threshold is less than the reporting threshold described above in relation to FIG. 4. The consecutive event warning threshold is one example of a "threshold value" or a "first threshold value." When the over-voltage counter is equal to the consecutive event warning threshold, the controller 204 generates an interrupt signal at block 610. For example, in FIG. 7, an interrupt signal is generated when the value of the over-voltage counter is equal to the consecutive event warning threshold of four at about 98 microseconds. After block 610 in FIG. 6, the method 600 returns to block 602 to again determine whether the voltage of the power rail is greater than or equal to the over-voltage threshold.

Returning to block 608, when the over-voltage counter is not equal to the consecutive event warning threshold, the controller 204 determines whether the over-voltage counter is equal to a consecutive event shutdown threshold at block 612. The consecutive event shutdown threshold is greater than the consecutive event warning threshold. For example, the consecutive warning shutdown threshold may be four and the consecutive event shutdown threshold may be eight. The consecutive event shutdown threshold is one example of a "second threshold value." When the over-voltage counter is not equal to the consecutive event shutdown threshold, the method 600 returns to block 602 to again determine whether the voltage of the power rail is greater than or equal to the over-voltage threshold. Alternatively, when the over-voltage counter is equal to the consecutive shutdown event threshold, the controller 204 generates a shutdown signal at block 614. For example, in FIG. 7, a shutdown signal is generated when the value of the over-voltage counter is equal to the consecutive event shutdown threshold of eight at about 112 microseconds. Upon receiving the shutdown signal, the safety controller 112 may instruct the system power supply 106 to perform an emergency shutdown. For example, the safety controller 112 may send one or more control signals to the system power supply 106 which cause the system power supply 106 to immediately disable all of the power rails. After block 614 in FIG. 6, the method 600 returns to block 602 to again determine whether the voltage of the power rail is greater than or equal to the over-voltage threshold.

Figure 8:
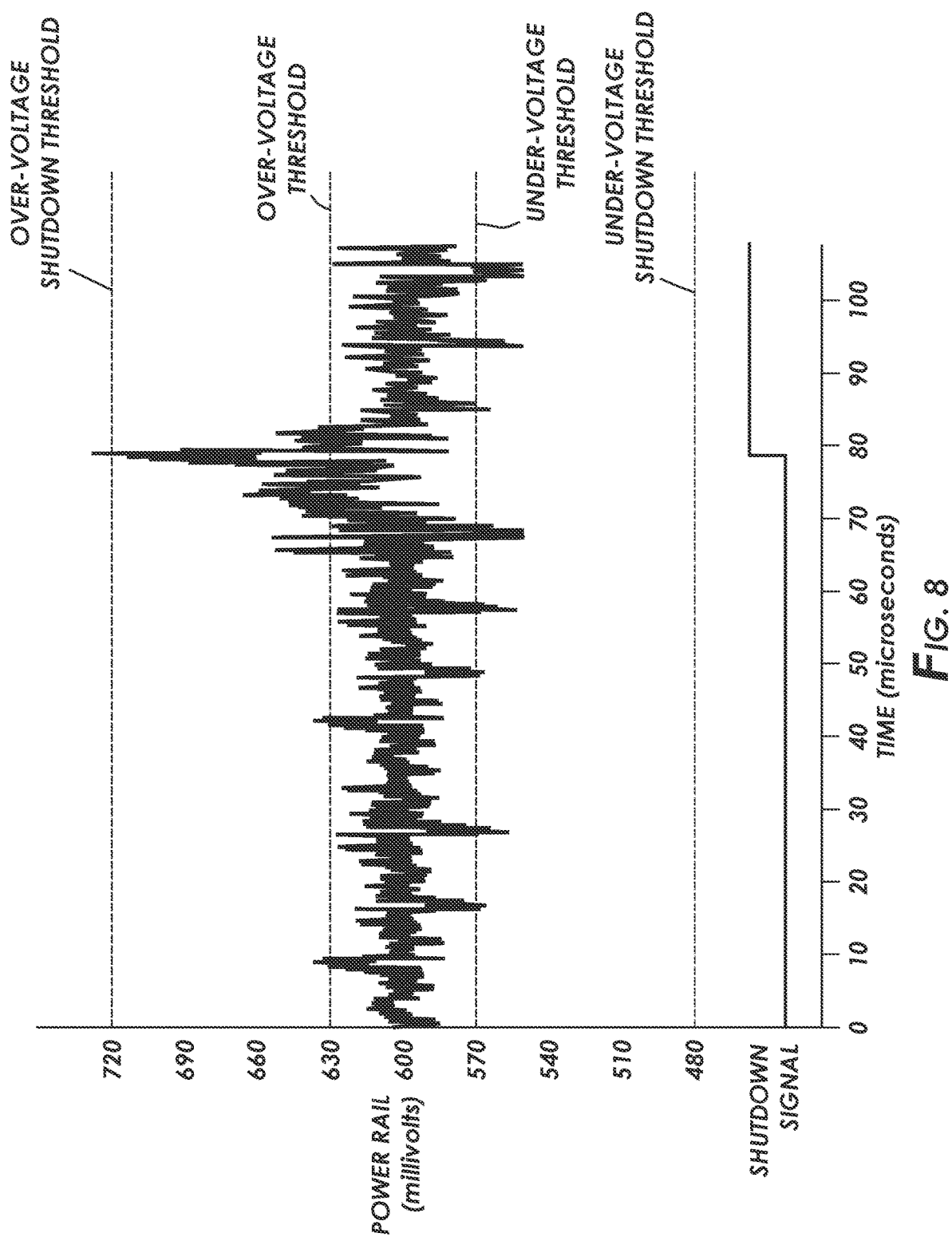
FIG. 8 is a timing diagram of an example of generating a shutdown signal using over-voltage and under-voltage shutdown thresholds in accordance with some implementations.

Extreme over-voltage events may almost instantly cause damage to the components in the load device 104. Thus, in some implementations, the controller 204 may generate a shutdown signal when the voltage of the power rail is greater than or equal to an over-voltage shutdown threshold. The over-voltage shutdown threshold is the minimum voltage level of the power rail which may almost immediately cause damage to the components in the load device 104. The over-voltage shutdown threshold is much higher than the over-voltage threshold described above. The over-voltage shutdown threshold may be set based on the technology used in the load device 104. For example, FIG. 8 is a timing diagram of an example of generating a shutdown signal using over-voltage and under-voltage shutdown thresholds. As illustrated in FIG. 8, the over-voltage threshold is 630 millivolts and the over-voltage shutdown threshold is 720 millivolts. A shutdown signal is generated in FIG. 8 when the voltage of the power rail is greater than 720 millivolts at about 79 microseconds. The over-voltage threshold is one example of a "first over-voltage threshold." The over-voltage shutdown threshold is one example of a "second over-voltage threshold."

Extreme under-voltage event in a power rail may almost instantly cause the load device 104 to make calculation errors. Thus, in some implementations, the controller 204 may generate a shutdown signal when the voltage of the power rail is less than or equal to an under-voltage shutdown threshold. The under-voltage shutdown threshold is the maximum voltage level of the power rail which may almost immediately cause the load device 104 to make calculation errors. The under-voltage threshold is much lower than the under-voltage threshold described above. The under-voltage shutdown threshold may be set based on the technology used in the load device 104. For example, in FIG. 8, the under-voltage warning threshold is 570 millivolts and the under-voltage shutdown threshold is 480 millivolts. The under-voltage threshold is one example of a "first over-voltage threshold." The under-voltage shutdown threshold is one example of a "second over-voltage threshold."

Figure 9:
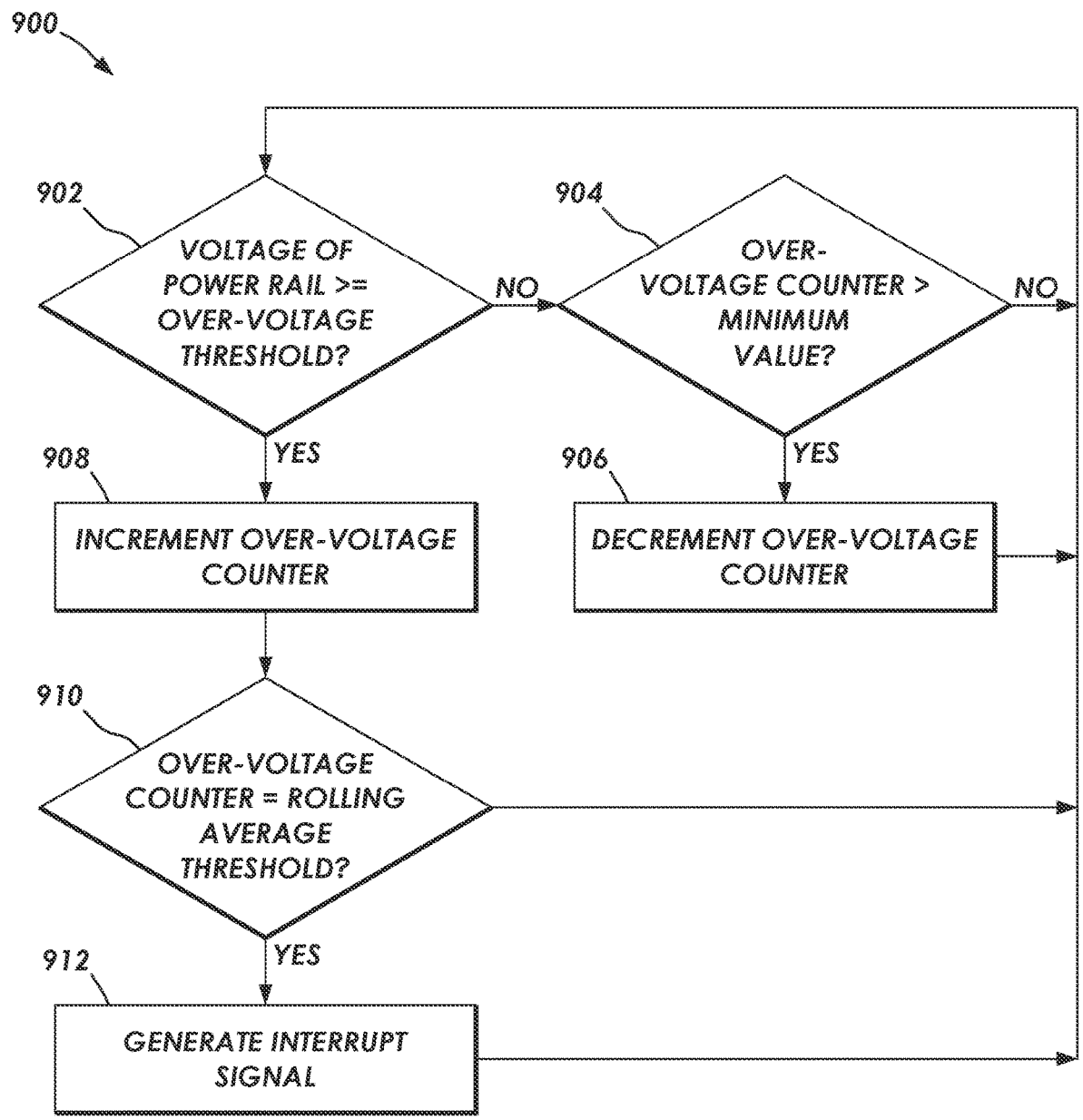
FIG. 9 is a flow diagram of an example of a method for tracking a moving average of over-voltage events of a power rail in accordance with some implementations.

In some implementations, the controller 204 may generate an interrupt signal when the over-voltage counter indicates that a moving average of over-voltage events is equal to a rolling average threshold. FIG. 9 is a flow diagram of an example of a method 900 for tracking a moving average of over-voltage events of a power rail in accordance with some implementations. For simplicity of explanation, the method 900 is described as a series of operations performed by the controller 204. However, the operations in accordance with the method 900 may be performed by different components. At block 902, the controller 204 determines whether the voltage of the power rail is greater than or equal to an over-voltage threshold. When the voltage of the power rail is less than the over-voltage threshold, the controller 204 determines whether the over-voltage counter is greater than a minimum value at block 904. When the over-voltage counter is equal to the minimum value (for example, equal to zero), the method 900 returns to block 902 to again determine whether the voltage of the power rail is greater than or equal to the over-voltage threshold. Alternatively, when the over-voltage counter is greater than the minimum value, the controller 204 decrements the over-voltage counter at block 906. For example, the controller 204 may decrease the value of the over-voltage counter by one when value of the over-voltage counter is greater than zero. Next, the method 900 returns to block 902 to again determine whether the voltage of the power rail is greater than or equal to the over-voltage threshold.

Figure 10:
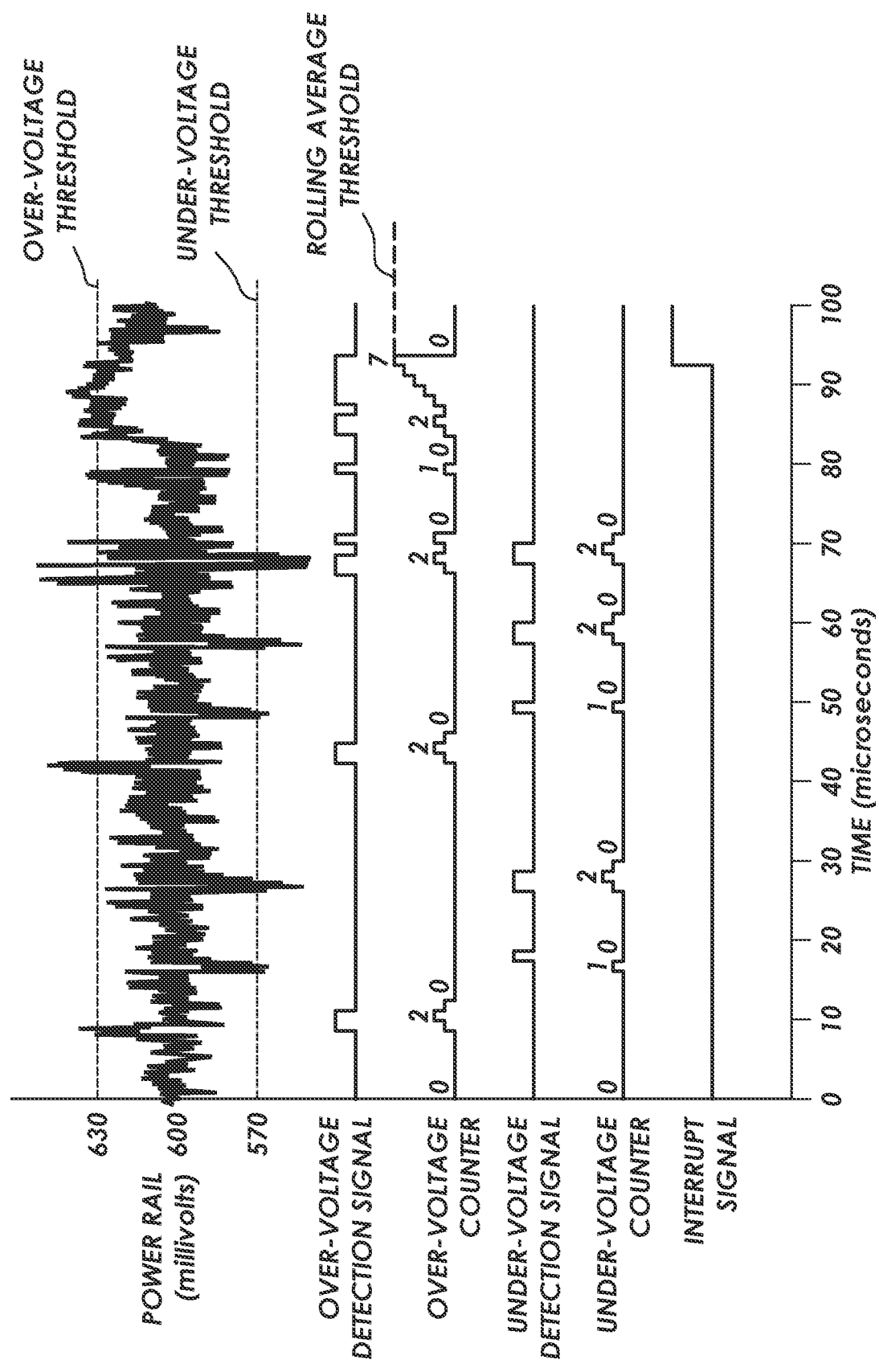
FIG. 10 is a timing diagram of an example of generating an interrupt signal based on moving averages of over-voltage and under-voltage events in accordance with some implementations.

When the voltage of the power rail is greater than or equal to the over-voltage threshold, the controller 204 increments the over-voltage counter at block 908. For example, FIG. 10 illustrates a timing diagram of an over-voltage counter that tracks moving average. As illustrated in FIG. 10, the value of the over-voltage counter is increased by one each time the voltage of the power rail is greater than or equal to the over-voltage threshold of 630 millivolts. Further, the value of the over-voltage counter in FIG. 10 is decreased by one each time the voltage of the power rail is less than the over-voltage threshold. Returning to FIG. 9, at block 910, the controller 204 determines whether the over-voltage counter is equal to a rolling average threshold. The rolling average threshold is one example of a "threshold value." When the over-voltage counter is not equal to the rolling average threshold, the method 900 returns to block 902 to again determine whether the voltage of the power rail is greater than or equal to the over-voltage threshold. Alternatively, when the over-voltage counter is equal to the rolling average threshold, the controller 204 generates an interrupt signal at block 912. For example, in FIG. 10, an interrupt signal is generated when the value of the over-voltage counter is equal to the rolling average threshold of seven at about 94 microseconds. After block 912 in FIG. 9, the method 900 returns to block 902 to again determine whether the voltage of the power rail is greater than or equal to the over-voltage threshold. In some implementations, the controller 204 may generate an interrupt signal when the under-voltage counter indicates that the moving average of under-voltage events is equal to the rolling average threshold.

The controller 204 may determine an average voltage of the power rail based on the moving average of over-voltage events and the moving average of under-voltage events. In some implementations, the controller 204 may determine an average voltage of the power rail using a weighting-based equation such as Equation 1 below:

$$\text{RAIL\_AVG} = \frac{(\text{OV\_MA} \times \text{OV\_THR}) + (\text{UV\_MA} \times \text{UV\_THR})}{\text{OV\_MA} + \text{UV\_MA}} \quad \text{Equation 1}$$

where RAIL_AVG is the average voltage of the power rail, OV_MA is the moving average of over-voltage events, OV_THR is the over-voltage threshold, UV_MA is the moving average of under-voltage events, and UV_THR is the under-voltage threshold. For example, the controller 204 may determine that the average voltage of power rail is 604.6 millivolts when the moving average of over-voltage events is 10, the over-voltage threshold is 630 millivolts, the moving average of under-voltage events is 6, and the under-voltage threshold is 570 millivolts.

As described above, the controller 204 may use the over-voltage counter to track the total number of over-voltage events, the number of consecutive over-voltage events, the moving average of over-voltage events, or a combination thereof. In some implementations, the controller 204 is configured to implement separate over-voltage counters to track different over-voltage statistics. For example, the controller 204 may use a first over-voltage counter to track the total number of over-voltage events, a second over-voltage counter to track the number of consecutive over-voltage events, and a third over-voltage counter to track the moving average of over-voltage events. Further, the controller 204 may use separate under-voltage counters to track different under-voltage statistics.

Figure 11:
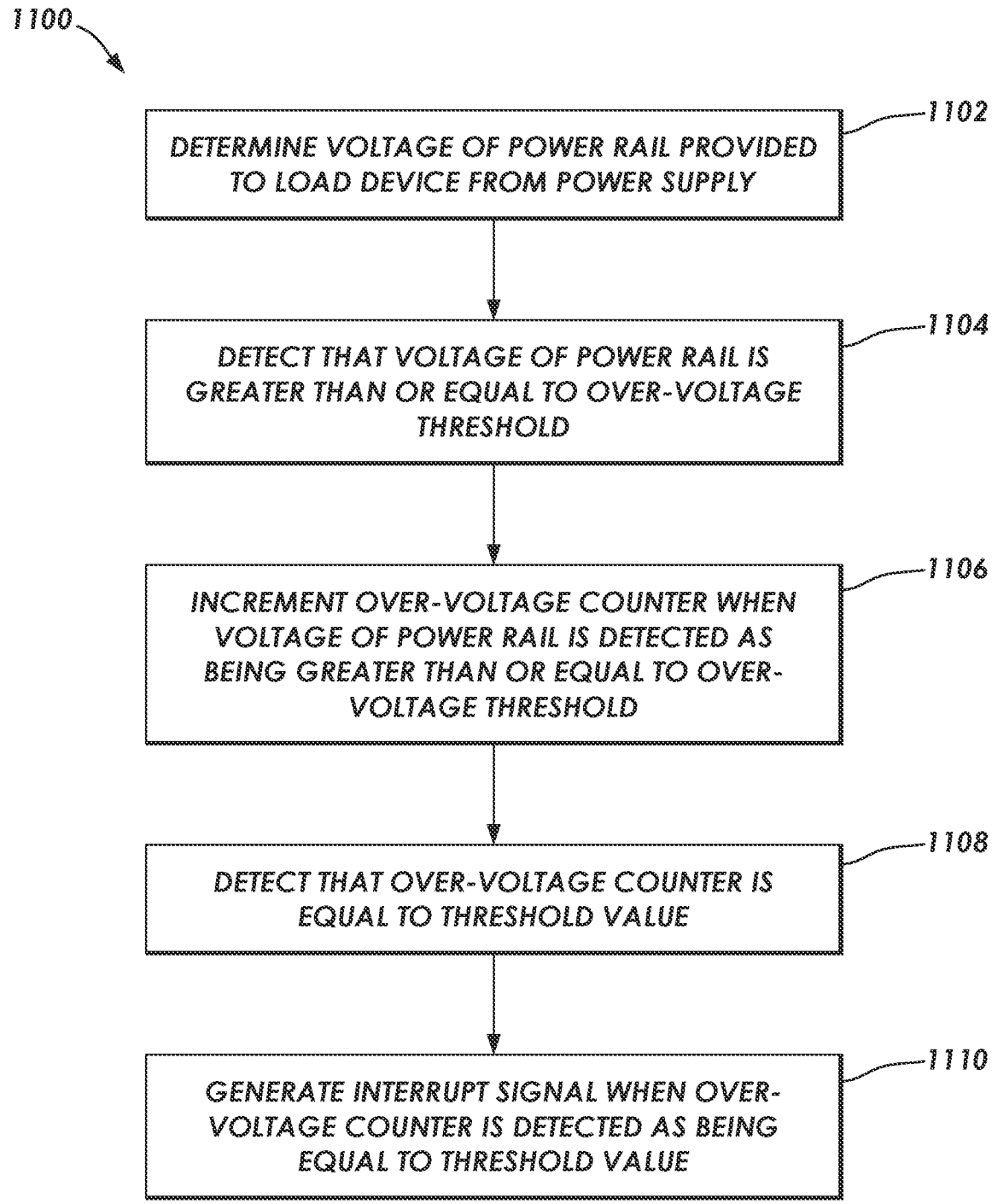
FIG. 11 is a flow diagram of an example of a method for operating a power supply circuit to detect over-voltage events in accordance with some implementations.

FIG. 11 is a flow diagram of an example of a method 1100 for operating the power supply circuit 102 to detect over-voltage events in accordance with some implementations. At block 1102, the controller 204 determines a voltage of the power rail provided to the load device 104 from the system power supply 106. At block 1104, the controller 204 detects that the voltage of the power rail is greater than or equal to an over-voltage threshold. At block 1106, the controller 204 increments the over-voltage counter when the voltage of the power rail is detected as being greater than or equal to the over-voltage threshold. At block 1108, the controller 204 detects that the over-voltage counter is equal to a threshold value. For example, the controller 204 may detect that the over-voltage counter is equal to the reporting threshold described above in relation to FIGS. 4 and 5, the consecutive event warning threshold described above in relation to FIGS. 6 and 7, or the rolling average threshold described above in relation to FIGS. 9 and 10. At block 1110, the controller 204 generates an interrupt signal when the over-voltage counter is detected as being equal to the threshold value.

Figure 12:
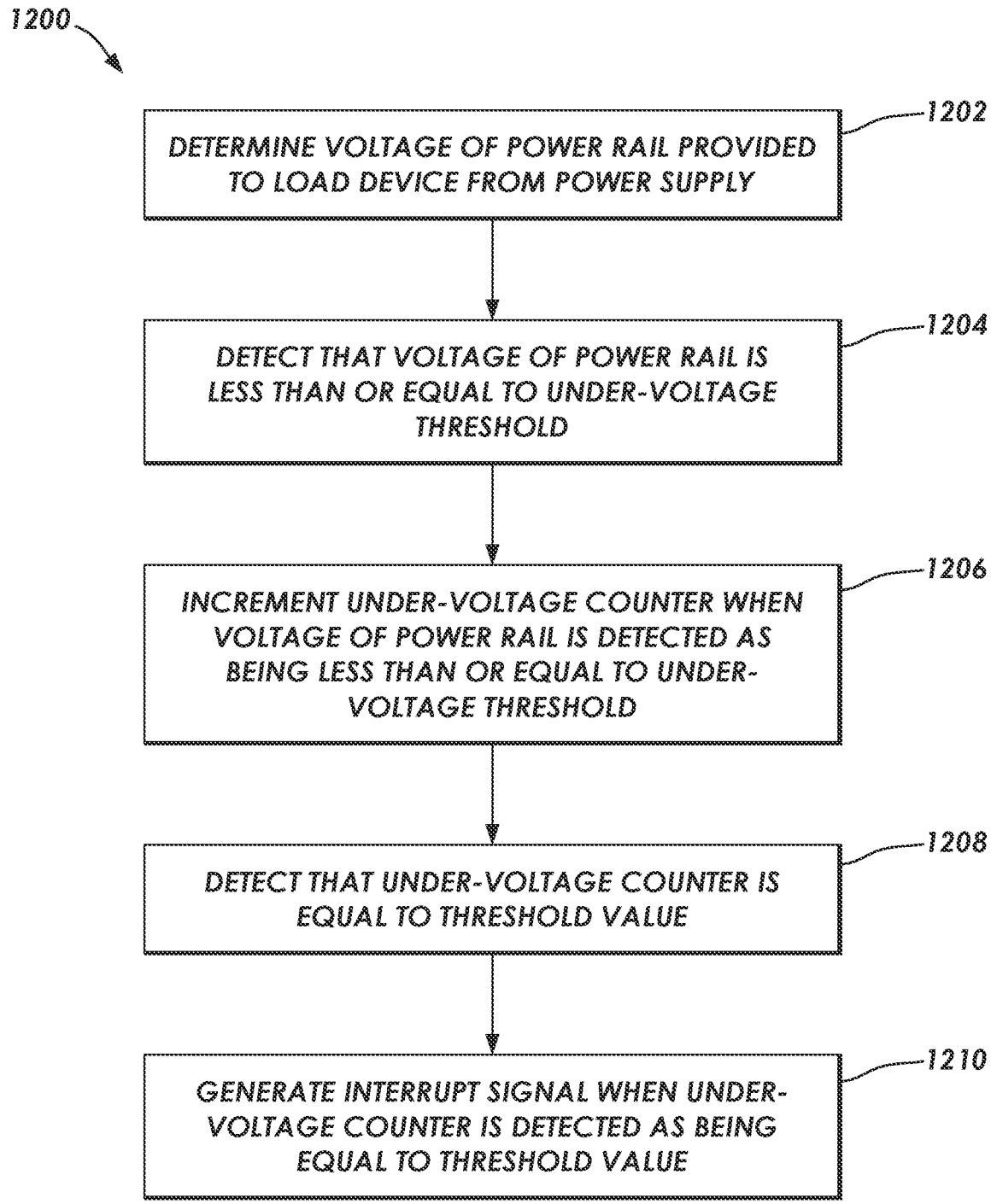
FIG. 12 is a flow diagram of an example of a method for operating a power supply circuit to detect under-voltage events in accordance with some implementations.

FIG. 12 is a flow diagram of an example of a method 1200 for operating the power supply circuit 102 to detect under-voltage events in accordance with some implementations. In some implementations, the operations of method 1200 described below may be performed sequentially with the operations of method 1100 described above. At block 1202, the controller 204 determines a voltage of the power rail provided to the load device 104 from the system power supply 106. At block 1204, the controller 204 detects that the voltage of the power rail is less than or equal to an under-voltage threshold. At block 1206, the controller 204 increments the under-voltage counter when the voltage of the power rail is detected as being less than or equal to the over-voltage threshold. At block 1208, the controller 204 detects that the under-voltage counter is equal to a threshold value. For example, the controller 204 may detect that the under-voltage counter is equal to the reporting threshold described above in relation to FIGS. 4 and 5, the consecutive event warning threshold described above in relation to FIGS. 6 and 7, or the rolling average threshold described above in relation to FIGS. 9 and 10. At block 1210, the controller 204 generates an interrupt signal when the under-voltage counter is detected as being equal to the threshold value.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various implementations of the present invention. Numerous variations and modifications will become apparent to those skilled in the art once the above disclosure is fully appreciated. It is intended that the following claims be interpreted to embrace all such variations and modifications.

What is claimed is:

1. A method for operating a power supply, the method comprising:
   determining a voltage of a power rail provided to a load device from the power supply;

detecting that the voltage of the power rail is greater than or equal to an over-voltage threshold;
incrementing an over-voltage counter when the voltage of the power rail is detected as being greater than or equal to the over-voltage threshold;
detecting that the over-voltage counter is equal to a threshold value; and
generating an interrupt signal when the over-voltage counter is detected as being equal to the threshold value.

2. The method of claim 1, wherein the threshold value is a first threshold value, and wherein the method further comprises:
detecting that the voltage of the power rail is less than or equal to an under-voltage threshold;
incrementing an under-voltage counter when the voltage of the power rail is detected as being less than or equal to the under-voltage threshold;
detecting that the under-voltage counter is equal to a second threshold value; and
generating the interrupt signal when the under-voltage counter is detected as being equal to the second threshold value.

3. The method of claim 2, further comprising:
determining a first moving average of over-voltage events for the power rail;
determining a second moving average of under-voltage events for the power rail; and
determining an average value of the voltage of the power rail based on the first moving average and the second moving average.

4. The method of claim 1, wherein the over-voltage threshold is a first over-voltage threshold, and wherein the method further comprises:
detecting that the voltage of the power rail is greater than or equal to a second over-voltage threshold, wherein the second over-voltage threshold is greater than the first over-voltage threshold, and
generating a shutdown signal when the voltage of the power rail is detected as being greater than or equal to the second over-voltage threshold.

5. The method of claim 1, further comprising:
sending a value of the over-voltage counter when the interrupt signal is generated; and
resetting the over-voltage counter to a minimum value after the value of the over-voltage counter is sent.

6. The method of claim 1, further comprising resetting the over-voltage counter to a minimum value when the voltage of the power rail is not detected as being greater than or equal to the over-voltage threshold.

7. A power monitor, comprising:
a voltage fault detector configured to:
determine a voltage of a power rail provided to a load device from a power supply, and
detect when the voltage of the power rail is greater than or equal to an over-voltage threshold; and
a controller configured to:
increment an over-voltage counter when the voltage fault detector detects that the voltage of the power rail is greater than or equal to the over-voltage threshold, and
generate an interrupt signal when the over-voltage counter is equal to a threshold value.

8. The power monitor of claim 7, wherein the threshold value is a first threshold value, wherein the voltage fault detector is further configured to detect when the voltage of the power rail is less than or equal to an under-voltage threshold, and wherein the controller is further configured to:
increment an under-voltage counter when the voltage fault detector detects that the voltage of the power rail is less than or equal to the under-voltage threshold, and
generate the interrupt signal when the under-voltage counter is equal to a second threshold value.

9. The power monitor of claim 7, wherein the controller is further configured to:
determine a first moving average of over-voltage events for the power rail,
determine a second moving average of under-voltage events for the power rail, and
determine an average value of the voltage of the power rail based on the first moving average and the second moving average.

10. The power monitor of claim 7, wherein the over-voltage threshold is a first over-voltage threshold, wherein the voltage fault detector is further configured to detect when the voltage of the power rail is greater than or equal to a second over-voltage threshold, wherein the second over-voltage threshold is greater than the first over-voltage threshold, and wherein the controller is further configured to generate a shutdown signal when the voltage fault detector detects that the voltage of the power rail is greater than or equal to the second over-voltage threshold.

11. The power monitor of claim 7, wherein the voltage fault detector includes a fast analog comparator.

12. The power monitor of claim 7, wherein the controller is further configured to reset the over-voltage counter to a minimum value when the voltage fault detector does not detect that the voltage of the power rail is greater than or equal to the over-voltage threshold.

13. The power monitor of claim 7, wherein the controller is further configured to decrement the over-voltage counter when:
the voltage fault detector does not detect that the voltage of the power rail is greater than or equal to the over-voltage threshold, and
the over-voltage counter is greater than a minimum value.

14. A power supply circuit, comprising:
a power supply configured to provide a power rail to a load device; and
a power monitor configured to:
detect when a voltage of the power rail is greater than or equal to an over-voltage threshold,
increment an over-voltage counter each time the power monitor detects that the voltage of the power rail is greater than or equal to the over-voltage threshold, and
generate an interrupt signal when the over-voltage counter is equal to a threshold value.

15. The power supply circuit of claim 14, further comprising a safety controller configured to:
receive the interrupt signal,
read-out a value of the over-voltage counter from the power monitor when the interrupt signal is received, and
reset the over-voltage counter to a minimum value after the value of the over-voltage counter is read-out.

16. The power supply circuit of claim 15, wherein the safety controller is further configured to adjust a target voltage of the power rail based on the value of the over-voltage counter.

17. The power supply circuit of claim 15, wherein the power supply is a system power supply, and wherein the power supply circuit further comprises a safety power supply configured to provide power to the safety controller independent of the system power supply.

18. The power supply circuit of claim 14, wherein the power monitor is further configured to reset the over-voltage counter when the power monitor does not detect that the voltage of the power rail is greater than or equal to the over-voltage threshold.

19. The power supply circuit of claim 18, wherein the threshold value is a first threshold value, and wherein the power monitor is further configured to:
   detect when the over-voltage counter is equal to a second threshold value, wherein the second threshold value is greater than the first threshold value, and
   generate a shutdown signal when the power monitor detects that the over-voltage counter is equal to the second threshold value.

20. The power supply circuit of claim 14, wherein the load device includes a System-on-a-Chip (SoC) device.

* * * * *